(12) United States Patent
Chen et al.

(10) Patent No.: US 9,595,650 B2
(45) Date of Patent: Mar. 14, 2017

(54) LED PACKAGE AND METHOD OF MANUFACTURING THE SAME

(71) Applicant: STARLITE LED INC., Fremont, CA (US)

(72) Inventors: Pao Chen, Milpitas, CA (US); Chung Chi Chang, San Jose, CA (US); Ming Chieh Huang, Fremont, CA (US)

(73) Assignee: STARLITE LED INC., Fremont, CA (US)

(*) Notice: Subject to any disclaimer, the term of this patent is extended or adjusted under 35 U.S.C. 154(b) by 0 days.

(21) Appl. No.: 15/147,850

(22) Filed: May 5, 2016

(65) Prior Publication Data

US 2016/0254431 A1    Sep. 1, 2016

Related U.S. Application Data

(63) Continuation of application No. 14/073,643, filed on Nov. 6, 2013, now abandoned.

(51) Int. Cl.
*H01L 33/62* (2010.01)
*H01L 33/64* (2010.01)
(Continued)

(52) U.S. Cl.
CPC ............ *H01L 33/64* (2013.01); *H01L 21/486* (2013.01); *H01L 21/4846* (2013.01); *H01L 21/4871* (2013.01); *H01L 23/49827* (2013.01); *H01L 23/49838* (2013.01); *H01L 23/49866* (2013.01); *H01L 33/0095* (2013.01); *H01L 33/48* (2013.01); *H01L 33/486* (2013.01); *H01L 33/58* (2013.01); *H01L 33/62* (2013.01); *H01L 33/641* (2013.01); *H01L 33/642* (2013.01);
(Continued)

(58) Field of Classification Search
CPC . H01L 33/62; H01L 21/4871; H01L 21/4846; H01L 21/486
See application file for complete search history.

(56) References Cited

U.S. PATENT DOCUMENTS 7,381,996 B2    6/2008   Hsin Chen
7,808,013 B2   10/2010   Mendendorp et al.
(Continued)

OTHER PUBLICATIONS

U.S. Appl. No. 14/073,643, Requirement for Restriction/Election mailed Nov. 17, 2014.
(Continued)

*Primary Examiner* — Dale E Page
*Assistant Examiner* — Vincent Wall
(74) *Attorney, Agent, or Firm* — Alston & Bird LLP

(57) ABSTRACT

A method is provided for manufacturing a LED package base including providing a metal core substrate having a top surface and a bottom surface and forming two first trenches in the metal core substrate. The first trenches extend from the top surface to the bottom surface. The method further includes at least partially filling in the first trenches with first dielectric material to form dielectric isolations. The dielectric isolations divide the metal core substrate into three metal core portions. Two of the metal core portions may be configured to serve as LED package electrodes. The method also includes applying a second dielectric material to cover at least a portion of the first dielectric material, and forming a conductive layer over the second dielectric material to form circuit contacts. The conductive layer includes a first conductive material.

9 Claims, 13 Drawing Sheets

(51) Int. Cl.
*H01L 33/48* (2010.01)
*H01L 33/00* (2010.01)
*H01L 21/48* (2006.01)
*H01L 23/498* (2006.01)
*H01L 33/58* (2010.01)

(52) U.S. Cl.
CPC .......... *H01L 2933/0033* (2013.01); *H01L 2933/0066* (2013.01); *H01L 2933/0075* (2013.01)

(56) References Cited

U.S. PATENT DOCUMENTS

| | | |
|---|---|---|
| 8,604,499 B2 | 12/2013 | Nakayama et al. |
| 2004/0195581 A1 | 10/2004 | Isoda |
| 2008/0043444 A1 | 2/2008 | Hasegawa et al. |
| 2008/0261339 A1 | 10/2008 | Koung et al. |
| 2011/0215357 A1 | 9/2011 | Wang et al. |
| 2012/0236568 A1 | 9/2012 | Lee et al. |
| 2014/0264427 A1 | 9/2014 | Tischler |

OTHER PUBLICATIONS

U.S. Appl. No. 14/073,643, Non-Final Office Action mailed Mar. 11, 2015.
U.S. Appl. No. 14/073,643, Final Office Action mailed Nov. 19, 2015.
U.S. Appl. No. 14/073,643, Notice of Allowance mailed Feb. 12, 2016.

LED PACKAGE AND METHOD OF MANUFACTURING THE SAME

CROSS-REFERENCE TO RELATED APPLICATIONS

This application is a continuation of U.S. patent application Ser. No. 14/073,643, titled "LED Package and Method of Manufacturing The Same," filed Nov. 6, 2013, which is incorporated by reference herein in its entirety.

TECHNICAL FIELD

The example embodiments of the present invention generally relate to light emitting diode (LED) packages, and more particularly to designs and fabrication processes of light emitting diode package bases.

BACKGROUND

A LED package typically includes a LED chip bonded on a package base with an optical-based lens system covering the LED chip. The LED package is typically mounted on a printed circuit board (PCB) which provides electrical current to the LED chip. The LED package illuminates when electrical current flows through the LED package.

Conventional LED packages may face challenges in many aspects, such as light distribution of the LED and thermal management. Light distribution is the basis of the LED when LEDs are applied to the light sources in any kind of light application. Insufficient thermal dissipation may result in overheating, which may cause severe performance degradation or permanent damage to the PCB. To improve thermal dissipation, a substrate may be used, which may increase the cost of the LED package. It is desired to improve light distribution and thermal dissipation of a LED package.

BRIEF SUMMARY

According to one exemplary embodiment of the present invention, a method of manufacturing a light emitting diode (LED) package base comprises providing a metal core substrate having a top surface and a bottom surface and forming two first trenches in the metal core substrate. The first trenches extend from the top surface to the bottom surface. The method further comprises filling in the first trenches with first dielectric material to form dielectric isolations. The dielectric isolations divide the metal core substrate into three metal core portions. Two of the metal core portions serve as light emitting diode package electrodes. The method also comprises applying a second dielectric material to cover at least a portion of the first dielectric material and forming a conductive layer over the second dielectric material to form circuit contacts. The conductive layer includes a first conductive material.

According to one exemplary embodiment of the present invention, a light emitting diode (LED) package base comprises a metal core substrate having top surface and bottom surface and two dielectric isolations. The dielectric isolations are formed from the top surface to the bottom surface of the metal core substrate to divide the metal core substrate into three metal core portions. Two of the three metal core portions serve as light emitting diode package electrodes. The dielectric isolations comprise a first dielectric material. The light emitting diode package base comprises a dielectric layer covering at least a portion of the first dielectric material. The dielectric layer includes a second dielectric material. The light emitting diode package base also comprises a conductive layer formed on the dielectric layer. The conductive layer serves as circuit contacts. The conductive layer comprises a first conductive material. The light emitting diode package base further comprises at least two conductive vias formed through the conductive layer and the dielectric layer. The conductive vias comprises a second conductive material. Each conductive via connects a circuit contact to a metal core portion.

According to one exemplary embodiment of the present invention, a light emitting diode (LED) package comprises a light emitting diode (LED) package base and a light emitting diode (LED) chip. Contact pads of the light emitting diode chip are electrically coupled to an associated light emitting diode package electrode through circuit contacts and conductive vias. A thermal pad of the light emitting diode chip is thermally coupled to a thermal projection via bonding material. The circuit contacts may comprise different conductive material than that of the conductive vias.

These characteristics as well as additional features, functions, and details of various embodiments are described below. Similarly, corresponding and additional embodiments are also described below.

BRIEF DESCRIPTION OF THE DRAWING(S)

Having thus described the example embodiments of the present invention in general terms, reference will now be made to the accompanying drawings, which are not necessarily drawn to scale, and wherein:

DETAILED DESCRIPTION

The present disclosure now will be described more fully with reference to the accompanying drawings, in which some, but not all embodiments of the disclosure are shown. This disclosure may be embodied in many different forms and should not be construed as limited to the embodiments set forth; rather, these example embodiments are provided so that this disclosure will be thorough and complete, and will fully convey the scope of the disclosure to those skilled in the art. Like numbers refer to like elements throughout. "Example," "exemplary" and like terms as used herein refer to "serving as an example, instance or illustration."

Figure 1:
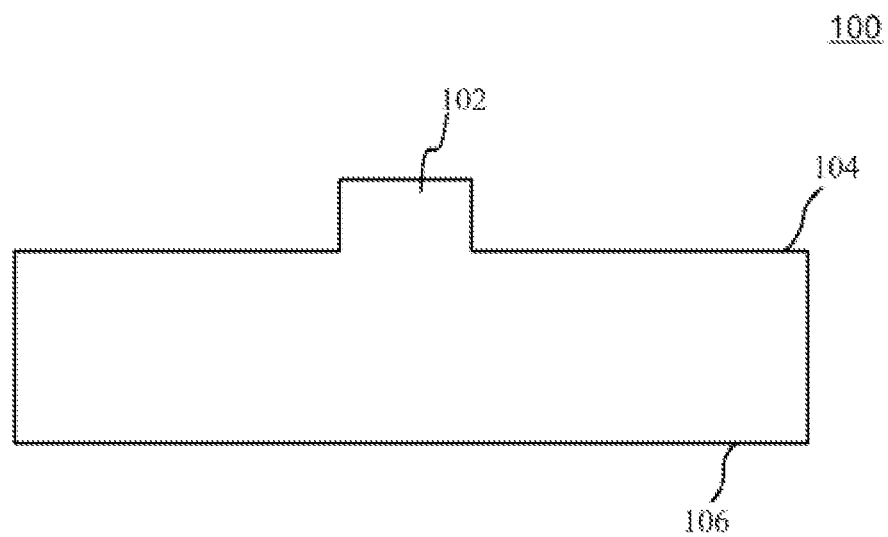
FIG. 1 illustrates a cross-sectional view of a metal core substrate according to some example embodiments of the present invention.

FIG. 1 illustrates a cross-sectional view of a metal core substrate 100 according to some example embodiments of the present invention. The metal core substrate 100 may comprise a top surface 104 and a bottom surface 106. A thermal projection 102 may be formed on top surface 104 of the metal core substrate 100, such as by one of mechanical carving, mechanical punch, chemical etching and laser carving. The metal core substrate 100 may comprise thermal conductive material, such as Cu, Al, Au, Ni, metal alloy, graphite, or other thermal conductive material. The thermal projection 102 may comprise thermal conductive material, such as Ag, Cu, Au, Sn, Ni, and Al. The thermal projection 102 may comprise the same material as that of the metal core substrate 100.

Figure 2:
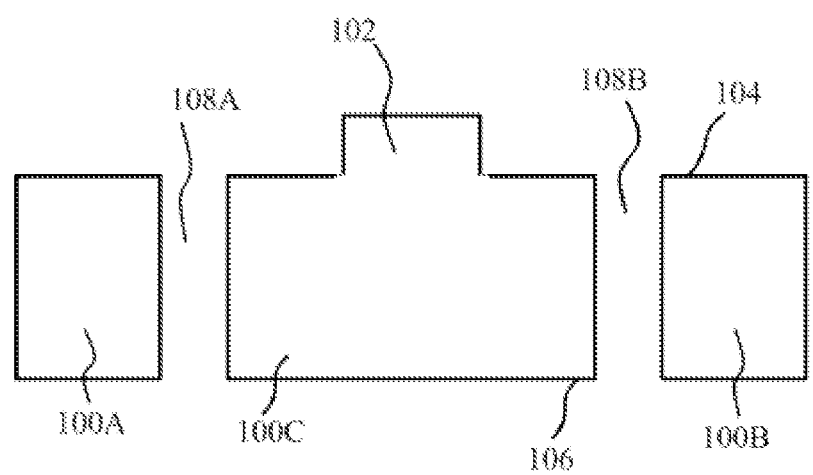
FIG. 2 illustrates a cross-sectional view of forming first trenches in the metal core substrate according to some example embodiments of the present invention.

At least two first trenches, such as 108A and 108B, may be formed in the metal core substrate 100 according to some example embodiments of the present invention, as illustrated in FIG. 2. The first trenches 108A and 108B may be formed, for example, by mechanical carving, mechanical punch, chemical etching, or laser carving. The first trenches 108A and 108B may extend from the top surface 104 to the bottom surface 106 and divide the metal core substrate 100 into three metal core portions, such as 100A, 100B, and 100C. Two of the metal core portions, such as the metal core portions 100A and 100B, may serve as light emitting diode package electrodes. The thermal projection 102 may be on top of the center metal core portion 100C.

Figure 3A:
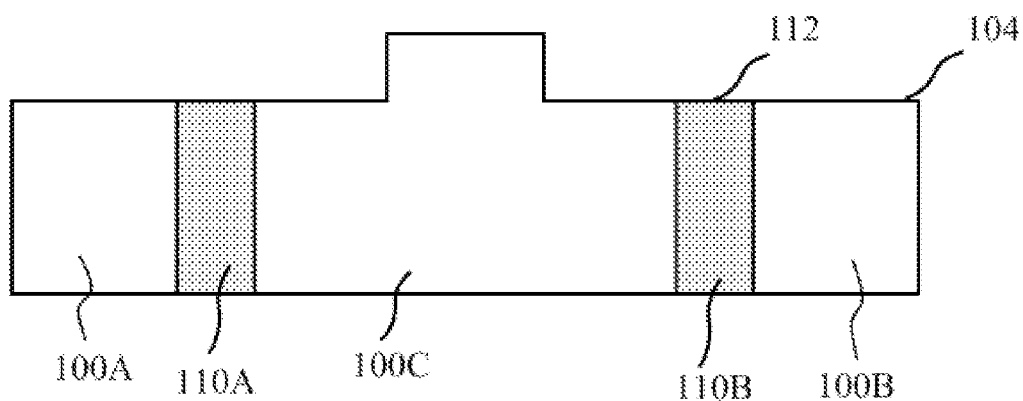
FIGS. 3A and 3B illustrate cross-sectional views of dielectric isolations according to some example embodiments of the present invention.
Figure 3B:
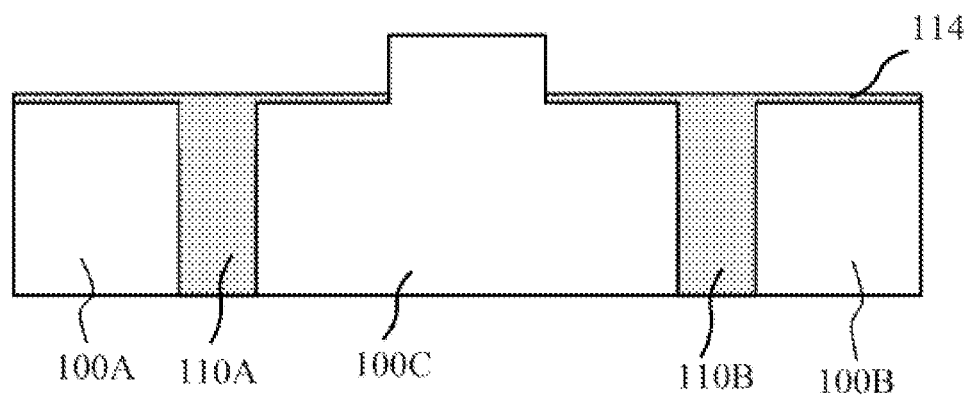

The first trenches 108A and 108B may be at least partially or completely filled with a first dielectric material to form dielectric isolations, such as dielectric isolations 110A and 110B, such as by physical vapor deposition, chemical vapor deposition, material molding or injection. Each of the dielectric isolations may electrically isolate two adjacent metal core portions. For example, as shown in FIGS. 3A and 3B, the dielectric isolation 110A may electrically isolate the metal core portion 100A and 100C. The dielectric isolation 110B may electrically isolate the metal core portion 100B and 100C. The first dielectric material may comprise, for example, at least one of epoxy, polymer resin, a pre-preg composite, $Al_2O_3$, AlN, and $SiO_2$. In one embodiment, the first dielectric material may be removed from the top surface 104 to make surface of the dielectric isolations, such as dielectric isolation surface 112, planar to the top surface 104 as shown in FIG. 3A. In another embodiment, the first dielectric material may also be applied to the top surface 104 to form a first dielectric layer 114, as shown in FIG. 3B.

A layer comprising a second dielectric material may be applied to cover at least a portion of the first dielectric material. For example, referring to FIG. 4A, layer 116 comprising a second dielectric material may be formed on the top surface of the metal core substrate 100 and cover surfaces of the dielectric isolations 110A and 110B. In another embodiment, layer 116 comprising a second dielectric material may be formed on the first dielectric layer 114, as shown in FIG. 4B. The second dielectric material may comprise, for example, at least one of epoxy, polymer resin, a pre-preg composite, $Al_2O_3$, AlN, plastic, and $SiO_2$. The second dielectric material may be the same as the first dielectric material, or different than the first dielectric material. The layer 116 may be formed, for example, using physical vapor deposition, such as sputtering and thermal evaporation, or chemical vapor deposition, such as reaction mechanism, or lamination, such as directly pressing the pre-formed dielectric layer over the substrate.

Figure 4A:
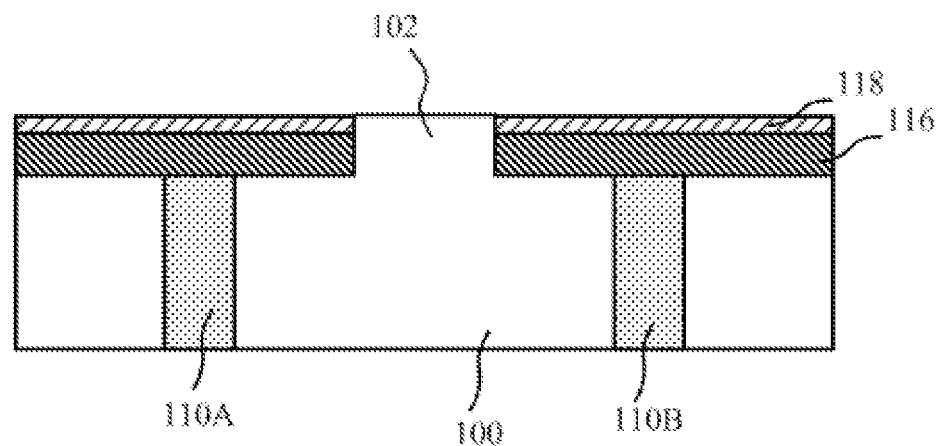
FIGS. 4A and 4B illustrate cross-sectional views of forming a dielectric layer and a conductive layer according to some example embodiments of the present invention.
Figure 4B:
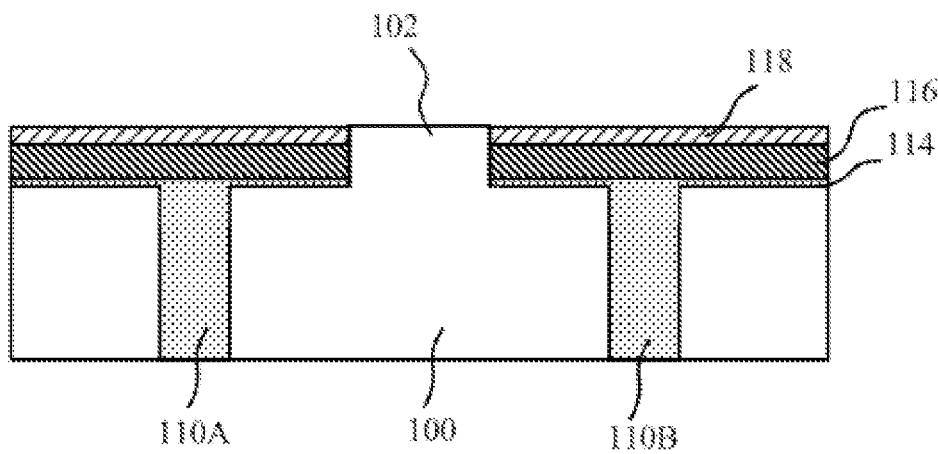

Still referring to FIGS. 4A and 4B, a conductive layer 118 may be formed on the dielectric layer 116, such as using physical vapor deposition, chemical vapor deposition, electrical plating or conductive foil lamination. The conductive layer 118 may comprise a first conductive material, such as one or more of Cu, Al, Au, Ni, Ti, Ag, Sn, and metal alloy. An etching process may be subsequently applied to remove the first conductive material from surface of the thermal projection 102 resulting in a planar top surface of the conductive laser 118 and the thermal projection 102.

Figure 5A:
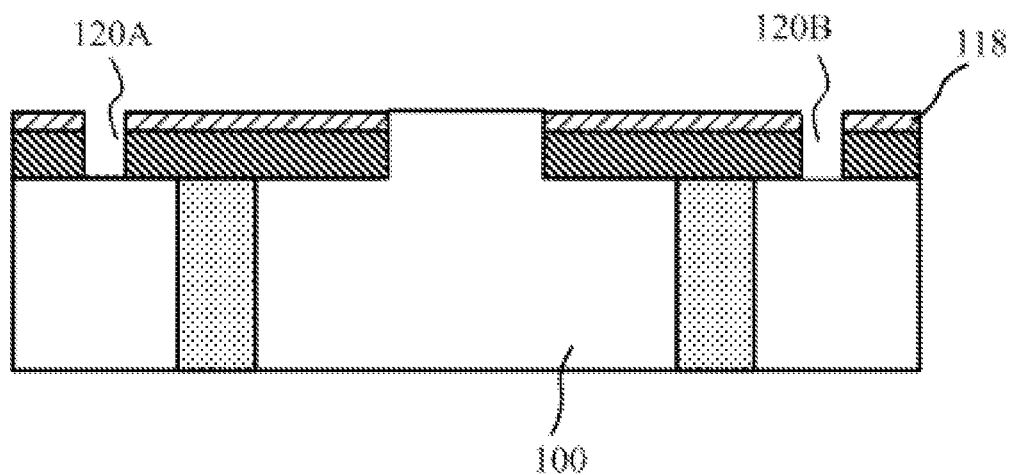
FIGS. 5A and 5B illustrate cross-sectional views of forming second trenches according to some example embodiments of the present invention.
Figure 5B:
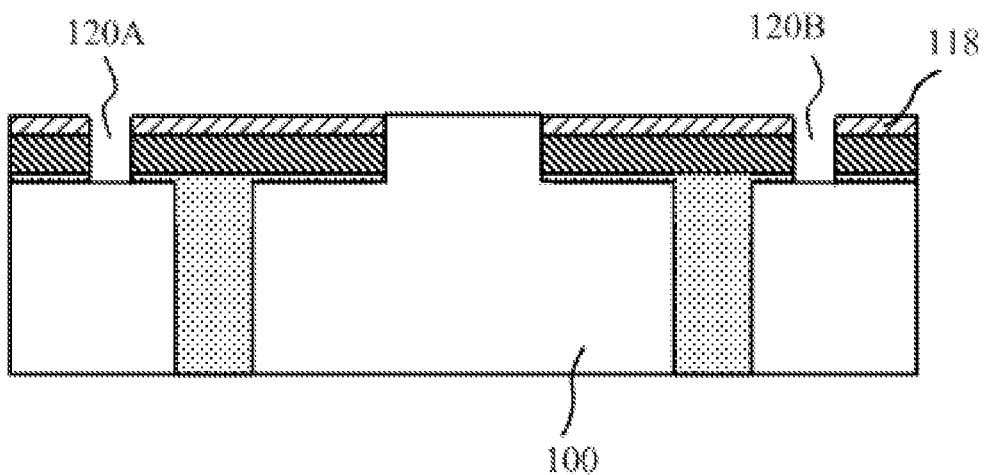

As shown in FIGS. 5A and 5B, at least two second trenches, such as 120A and 120B, may be formed. The second trenches 120A and 120B may extend from top surface of the conductive layer 118 to the top surface of the metal core substrate 100. The second trenches may be formed, for example, by one of mechanical carving, mechanical punch, chemical etching and laser carving.

Figure 6A:
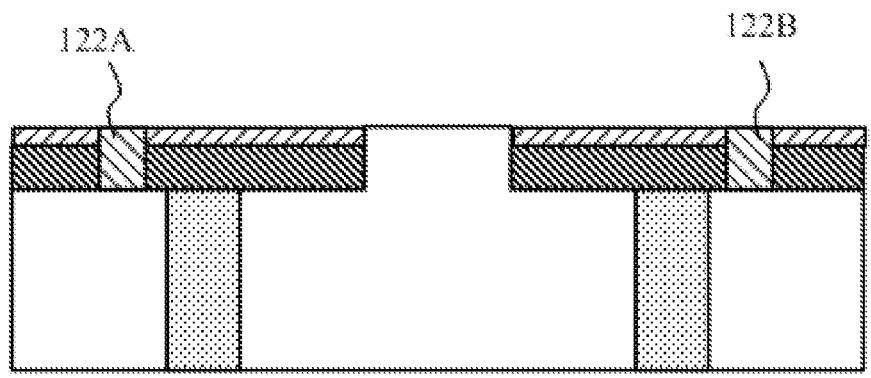
FIGS. 6A and 6B illustrate cross-sectional views of conductive vias according to some example embodiments of the present invention.
Figure 6B:
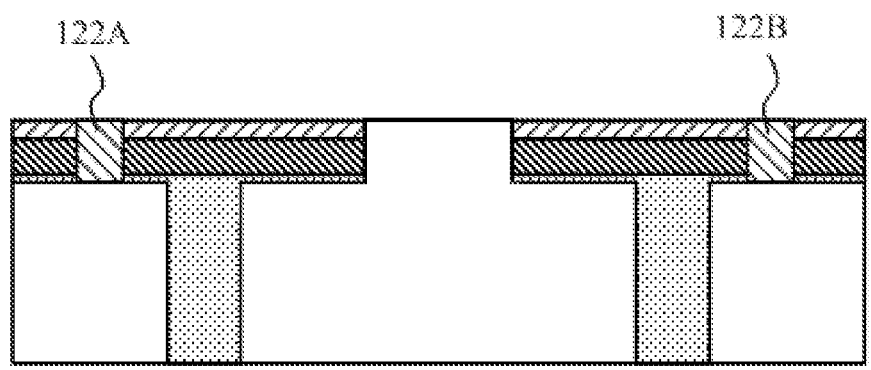

Referring to FIGS. 6A and 6B, the second trenches 120A and 120B (shown in FIGS. 5A and 5B) may be at least partially or completely filled with a second conductive material to form conductive vias, such as 122A and 122B, such as by one of metal plating, metal sputtering deposition, and metal liquid deposition. Filing the second trenches may be followed by a polishing process, such as a chemical mechanical polishing process, resulting in a planar surface. The second conductive material may comprise at least one of Cu, Al, Au, Ni, Ti, Ag, Sn, and metal alloy. The second conductive material may be the same as the first conductive material, or different than the first conductive material.

Figure 7A:
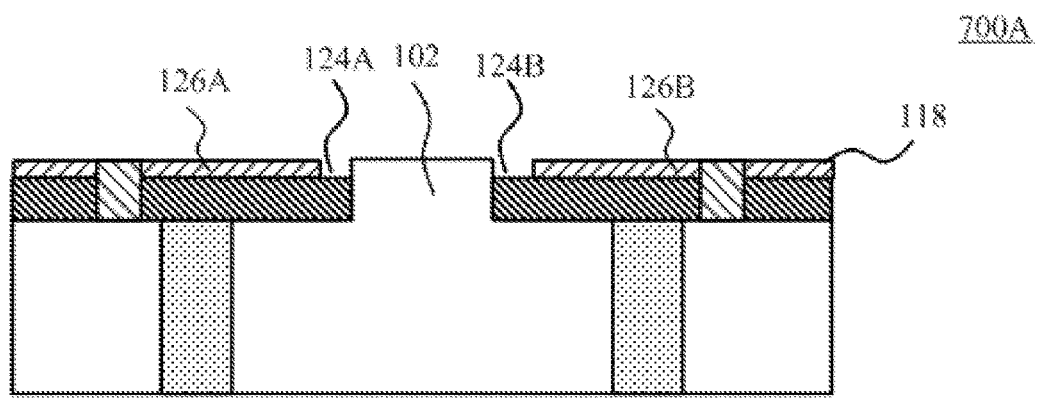
FIGS. 7A and 7B illustrate cross-sectional views of forming circuit contacts according to some example embodiments of the present invention.
Figure 7B:
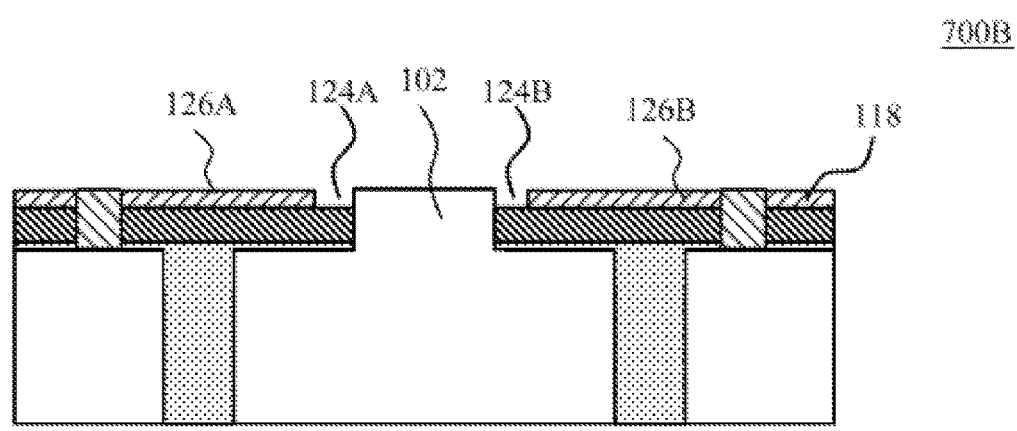

To form circuit contacts, a process, such as mechanical carving, mechanical punch, chemical etching, or laser carving, may be applied to remove undesired material from the conductive layer 118. For example, as shown in FIGS. 7A and 7B, undesired material may be removed to form two spaces 124A and 124B. One space, for example, the space 124A, may be formed on one side of the thermal projection 102. The other space 124B may be formed on the other side of the thermal projection 102. As a result, circuit contacts, such as 126A and 126B are formed. Each circuit contact may be separated from the thermal projection 102 by a space such as circuit contact 126A separated by space 124A from thermal projection 102. A light emitting diode package base 700A and a light emitting diode package base 700B may be achieved and are respectively illustrated in FIGS. 7A and 7B.

Figure 8A:
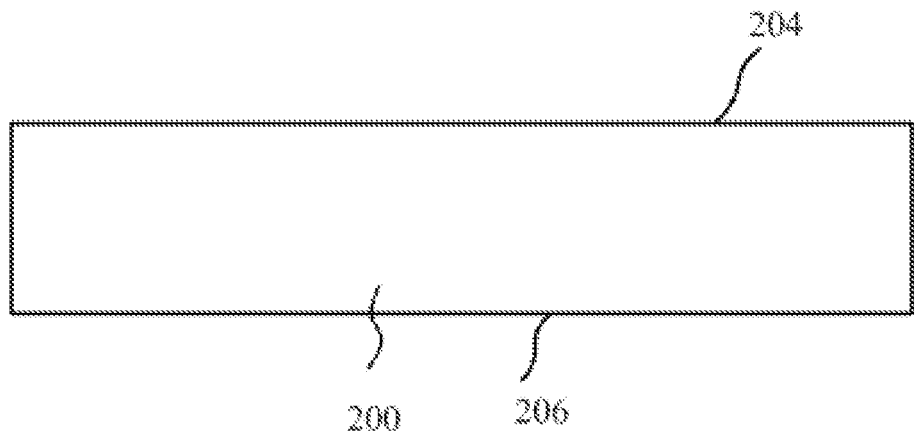
FIG. 8A illustrates a cross-sectional view of a metal core substrate according to some example embodiments of the present invention.
Figure 8B:
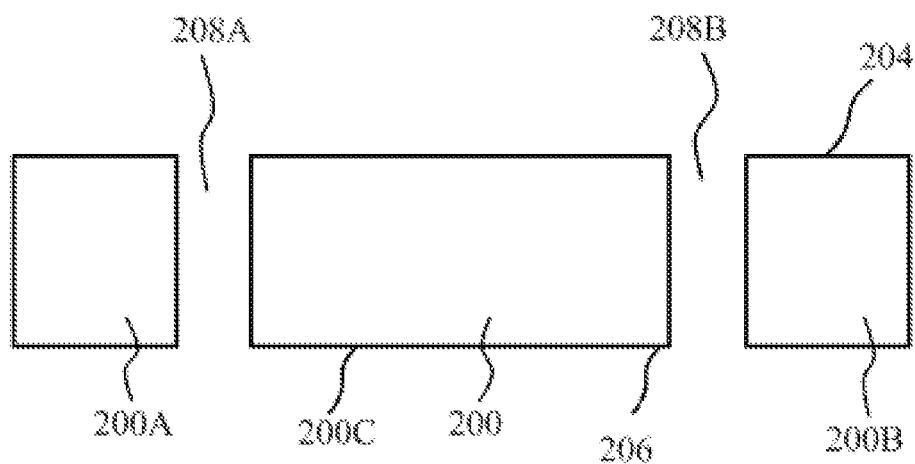
FIG. 8B illustrates a cross-sectional view of forming a first trenches in the metal core substrate according to some example embodiments of the present invention.

In another embodiment, as illustrated in FIG. 8A, a metal core substrate 200 is provided. The metal core substrate 200 may comprise a planar top surface 204 and a bottom surface 206. As shown in FIG. 8B, at least two first trenches, such as 208A and 208B, may be formed in metal are substrate 200 extending from the top surface 204 to the bottom surface 206. The first trenches 208A and 208B may be formed, for example, by mechanical carving, mechanical punch, chemical etching, or laser carving. The metal core substrate 200 may be divided into three metal core portions, such as metal core portions 200A, 200B, and 200C, by the first trenches 208A and 208B. As described above, two of the metal core portions, such as 200A and 200B, may serve as light emitting diode package electrodes. The metal core substrate 200 may comprise at least one of one of Cu, Al, Au, Ni, metal alloy, and graphite.

Figure 9A:
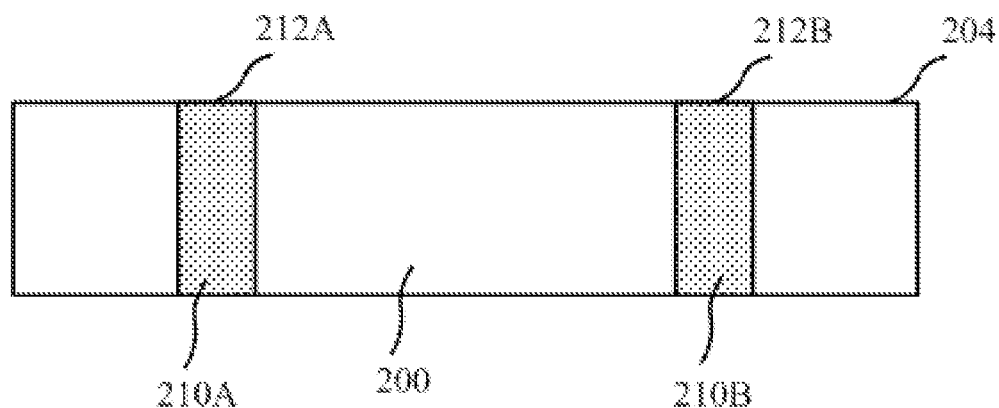
FIGS. 9A and 9B illustrate cross-sectional views of dielectric isolations according to some example embodiments of the present invention.
Figure 9B:
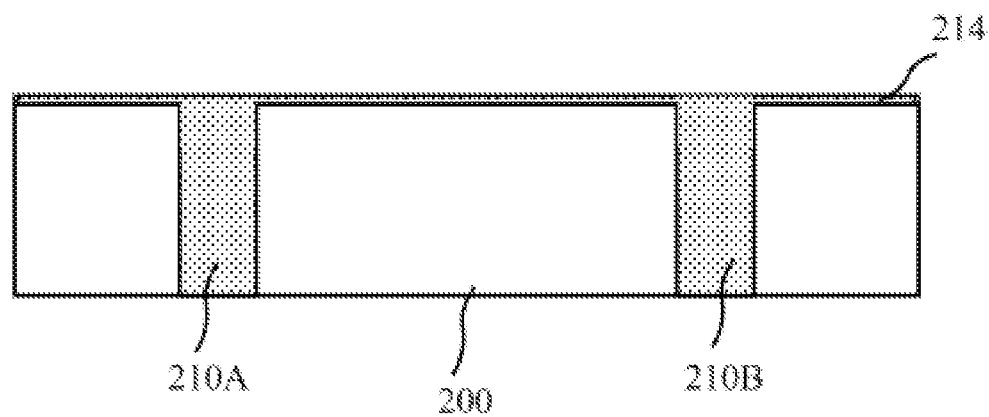

The first trenches 208A and 208B may be at least partially or completely filled with a first dielectric material to form dielectric isolations, such as 210A and 210B as shown in FIGS. 9A and 9B. The first dielectric material may comprise, for example, at least one of epoxy, polymer resin, a pre-preg composite, $Al_2O_3$, AlN, and $SiO_2$. In one embodiment, each of the dielectric isolations may have a surface planar to the top surface 204 of the metal core substrate 200. For example, the dielectric isolation 210A may have a surface 212A planar to the top surface 204, and the dielectric isolation 210B may have a surface 212B planar to the top surface 204, as shown in FIG. 9A. In another embodiment, the first dielectric material may be filled in the first trenches to form dielectric isolations 210A and 210B, and also applied to the top surface 204 of the metal core substrate 200 to form a first dielectric layer 214, as shown in FIG. 9B. The first dielectric layer 214 may comprise the same dielectric material as that of the dielectric isolations 210A and 210B.

Figure 10A:
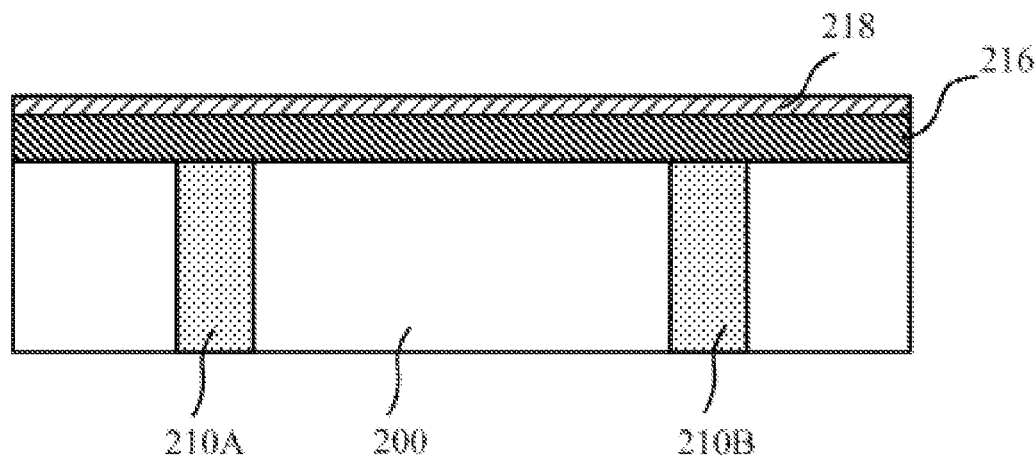
FIGS. 10A and 10B illustrate cross-sectional views of forming a second dielectric layer and a conductive layer according to some example embodiments of the present invention.
Figure 10B:
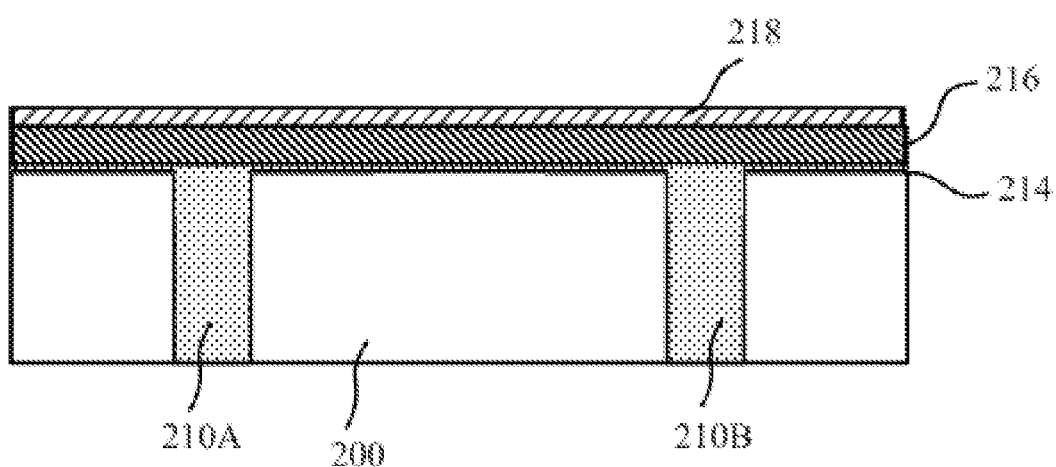

A second dielectric layer may be applied to cover at least a portion of the dielectric isolations. For example, referring to FIG. 10A, a second dielectric layer 216 may be applied to cover surfaces of the dielectric isolations 210A and 210B, and top surface 204 (shown in FIG. 9A) of the metal core substrate 200. In another embodiment as shown in FIG. 10B, the second dielectric layer 216 may be applied and formed on the first dielectric layer 214. The second dielectric layer 216 may comprise a second dielectric material. The second dielectric material may be the same as the first dielectric material, or different than the first dielectric material. A conductive layer 218 is then formed on the second dielectric layer 216, as shown in FIGS. 10A and 10B. The conductive layer 218 may comprise a first conductive material, such as at least one of Cu, Al, Au, Ni, Ti, Ag, Sn, and metal alloy.

Figure 11A:
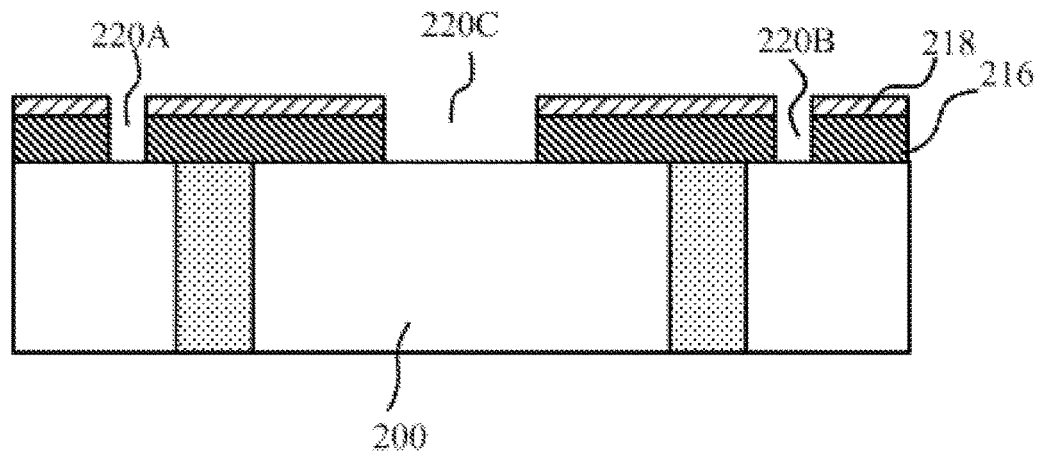
FIGS. 11A and 11B illustrate cross-sectional views of forming second trenches according to some example embodiments of the present invention.
Figure 11B:
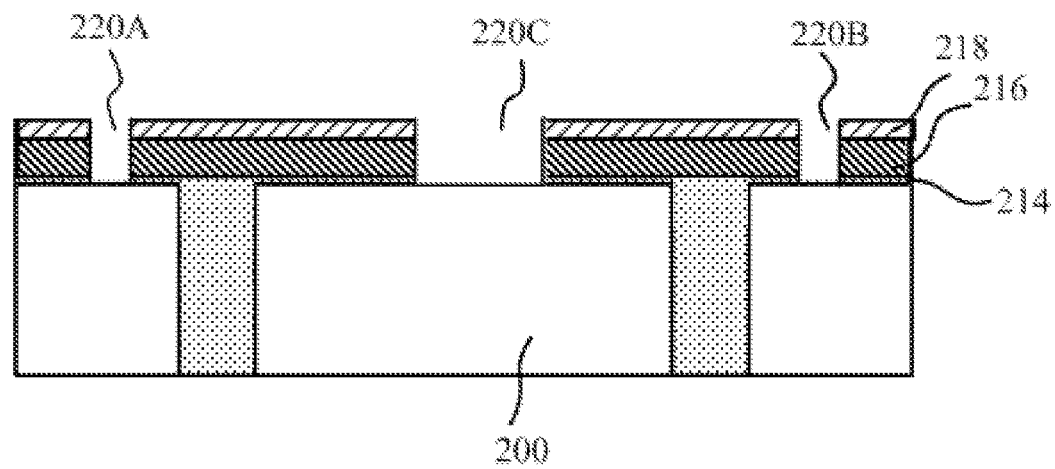

A plurality of second trenches, such as 220A, 220B, and 220C, are then formed to extend from top surface of the conductive layer 218 to the top surface of the metal core substrate 200. The second trenches 220A, 220B, and 220C may be formed, for example, by one of mechanical carving, mechanical punch, chemical etching, and laser carving. In one embodiment illustrated by FIG. 11A, the second trenches 220A, 220B, and 220C may extend through the conductive layer 218 and the dielectric layer 216 to the top surface of the metal core substrate 200. In another embodiment illustrated by FIG. 11B, the second trenches 220A, 220B, and 220C may extend through the conductive layer 218, the second dielectric layer 216, and the first dielectric layer 214 to the top surface of the metal core substrate 200.

Figure 12A:
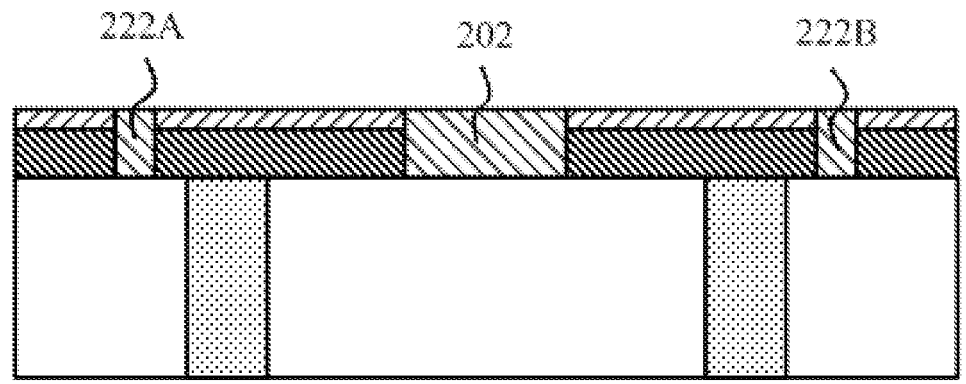
FIGS. 12A and 12B illustrate cross-sectional views of forming conductive vias according to some example embodiments of the present invention.
Figure 12B:
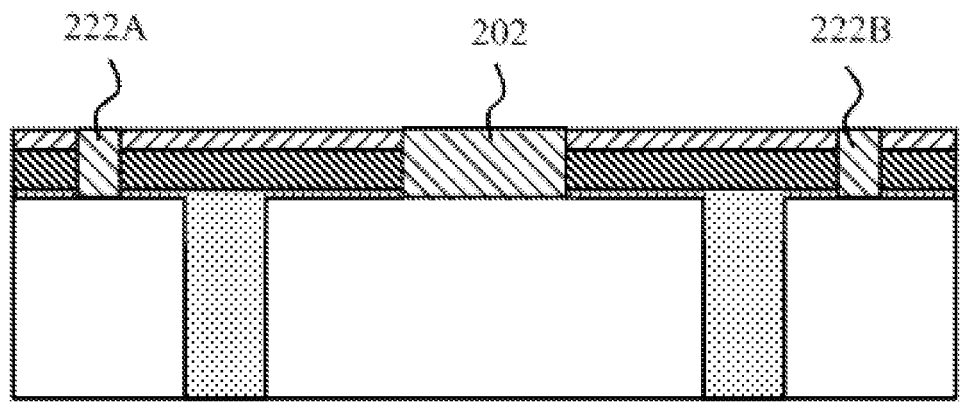

Some of the second trenches, such as the second trenches 220A and 220B may then be at least partially or completely filled with a second conductive material to form conductive vias 222A and 222B, shown in FIGS. 12A and 12B. At least one of the second trenches, such as the second trench 220C (shown in FIGS. 11A and 11B) may be filled with a thermal conductive material to form a thermal projection 202. The second conductive material may comprise, for example, at least one of Cu, Al, Au, Ni, Ti, Ag, Sn, and metal alloy. The thermal conductive material may comprise, for example, at least one of Ag, Cu, Au, Sn, Ni, and Al. The second trenches, such as 220A, 220B, and 220C, may be filled, for example, by applying one of metal plating, metal sputtering deposition, and metal liquid deposition processes.

Figure 13A:
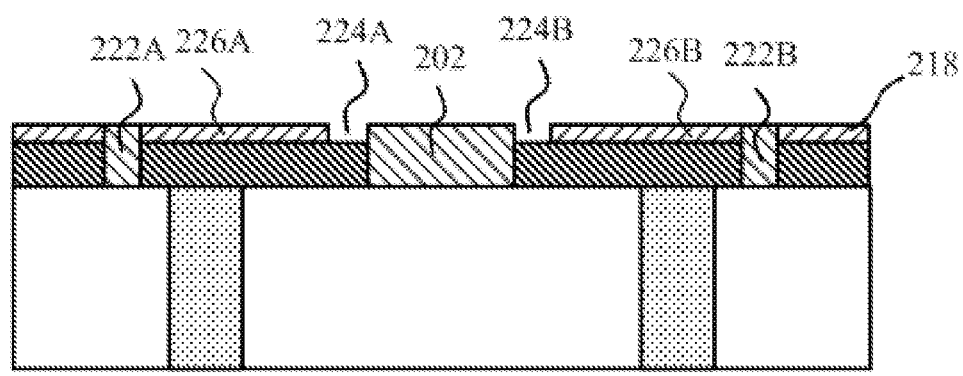
FIGS. 13A and 13B illustrate cross-sectional views of forming circuit contacts according to some example embodiments of the present invention.
Figure 13B:
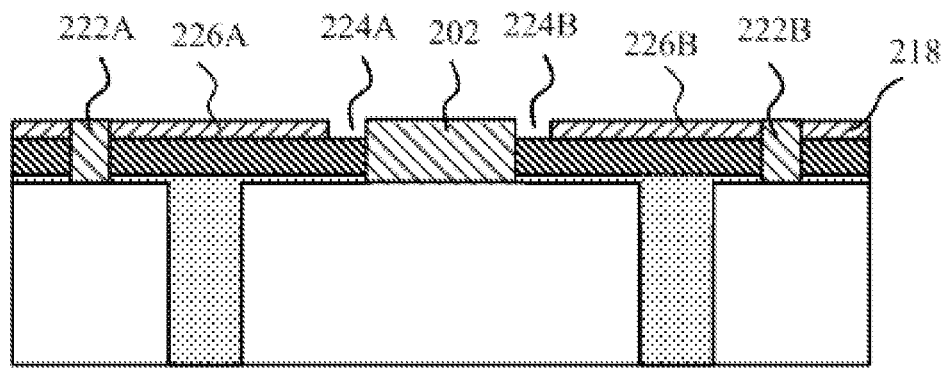

Similar to the above description of FIGS. 7A and 7B, a process, such as mechanical carving, mechanical punch, chemical etching, or laser carving, may be applied to remove undesired material from the conductive layer 218 to form circuit contacts. For example, as shown in FIGS. 13A and 13B, undesired material may be removed form two spaces 224A and 224B. One space, for example the space 224A, may be formed on one side of the thermal projection 202. The other space 224B may be formed on the other side of the thermal projection 202. As a result, circuit contacts, such as 226A and 226B, are formed. Each circuit contact may be separated from the thermal projection 202 by a space, such as spaces 224A and 224B. A light emitting diode package base 1300A and a light emitting diode package base 1300B may be obtained and are respectively illustrated in FIGS. 13A and 13B.

Figure 14:
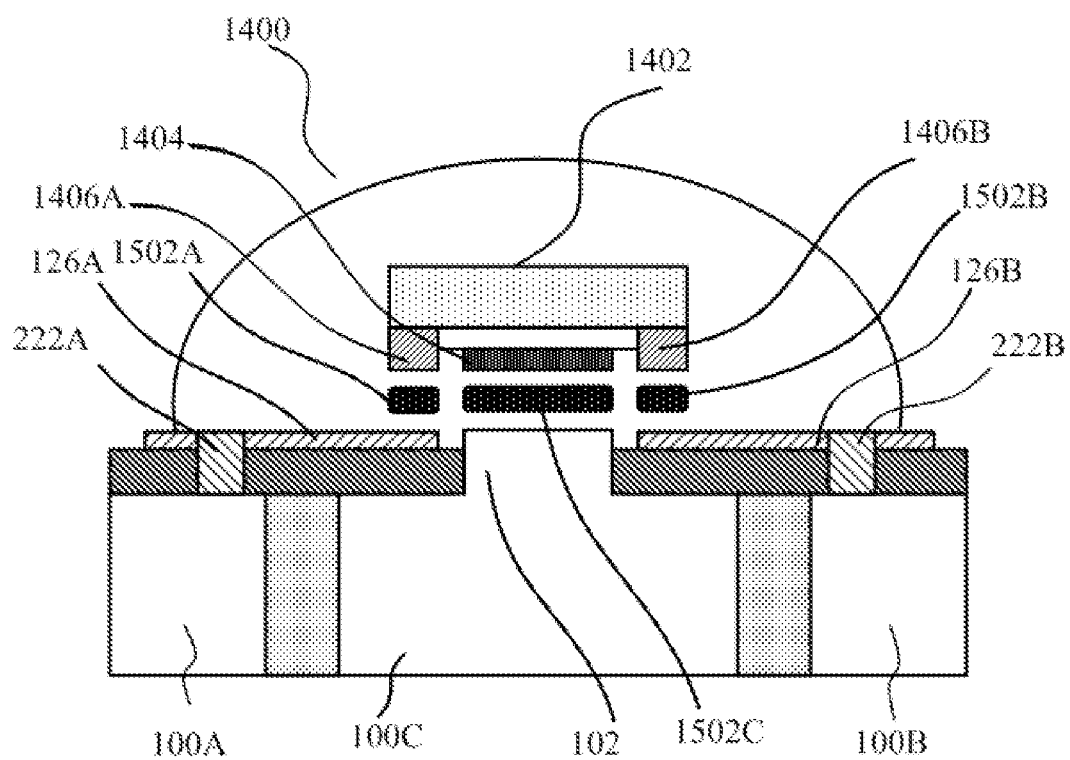
FIG. 14 illustrates a cross-sectional view of a light emitting diode package base assembled with a light emitting diode chip structure according to some example embodiments of the present invention.

FIG. 14 illustrates a cross-sectional view of light emitting diode package base 700A assembled with a light emitting diode chip structure 1400 according to some example embodiments of the present invention. The light emitting diode chip 1400 may also be assembled with one of the light emitting diode package bases 700B, 1300A, and/or 1300B described above. The light emitting diode chip structure 1400 may comprise a light emitting diode chip substrate 1402, a thermal pad 1404 on a passivation layer 1406 and contact pads 1408A, 1408B. When assembled, contact pads 1408A and 1408B of the light emitting diode chip structure 1400 may be electrically coupled to circuit contacts, such as 126A and 126B respectively (where 126a and 126b are portions of the conductive layer 118), through bonding material 1502A and 1502B. The thermal pad 1404 may be thermally coupled to the thermal projection 102 through bonding material 1502C.

In operation, the contact pad 1406A may electrically couple to the metal core portion 100A through circuit contact 126A and conductive via 122A. Similarly, the contact pad 1406B may electrically couple to the metal core portion 100B through circuit contact 126B and conductive via 122B.

Many modifications and other example embodiments set forth herein will come to mind to one skilled in the art to which these example embodiments pertain having the benefit of the teachings presented in the foregoing descriptions and the associated drawings. Therefore, it is to be understood that the embodiments are not to be limited to the specific ones disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the That which is claimed:

1. A method of manufacturing a light emitting diode package base comprising:
   providing a metal core substrate having a top surface, a bottom surface, and side surfaces;
   forming two first trenches in the metal core substrate, the first trenches extending from the top surface to the bottom surface;
   at least partially filling the first trenches with a first dielectric material to form dielectric isolations, the dielectric isolations dividing the metal core substrate into three metal core portions, wherein two of the metal core portions serve as the light emitting diode package electrodes, and wherein each outer portion of the light emitting diode package electrodes is one of the side surfaces of the metal core substrate;
   applying a second dielectric material to cover at least a portion of the first dielectric material;
   forming a first conductive layer over the second dielectric material to form circuit contacts, the first conductive layer including a first conductive material;
   forming second trenches extending from top surface of the conductive layer to the top surface of the metal core substrate; and
   partially filling the second trenches with a second conductive material to form conductive trenches.

2. The method of claim 1, further comprising forming the second trenches by one of mechanical carving, mechanical punch, chemical etching, or laser carving.

3. The method of claim 1, further comprising forming the conductive trenches by one of metal plating, metal sputtering deposition, or metal liquid deposition.

4. The method of claim 1, forming second trenches further comprising forming a thermal projection trench by one of mechanical carving, mechanical punch, chemical etching, or laser carving.

5. The method of claim 4, further comprising forming the thermal projection by filling the thermal projection trench with a second conductive material by one of metal plating, metal sputtering deposition, or metal liquid deposition techniques.

6. The method of claim 1, further comprising applying one of mechanical carving, mechanical punch, chemical etching, or laser carving to form the first trenches.

7. The method of claim 1, further comprising applying the second dielectric material to cover at least a portion of the top surface of the metal core substrate.

8. The method of claim 5, further comprising removing the first conductive layer around the thermal projection to isolate it from the circuit contacts.

9. The method of claim 8, wherein removing the first conductive layer around the thermal projection comprises applying one of mechanical carving, mechanical punch, chemical etching or laser carving techniques.

* * * * *